United States Patent
Wang et al.

(10) Patent No.: US 7,163,050 B2
(45) Date of Patent: Jan. 16, 2007

(54) HEAT DISSIPATING DEVICE

(75) Inventors: Dong Wang, Shenzhen (CN); Tsung-Lung Lee, Tu-Cheng (TW); Li He, Shenzhen (CN)

(73) Assignees: Fu Zhun Precision Industry (Shenzhen) Co., Ltd. (CN); Foxconn Technology Co., Ltd. (TW)

( * ) Notice: Subject to any disclaimer, the term of this patent is extended or adjusted under 35 U.S.C. 154(b) by 0 days.

(21) Appl. No.: 11/170,534

(22) Filed: Jun. 29, 2005

(65) Prior Publication Data

US 2006/0060332 A1 Mar. 23, 2006

(30) Foreign Application Priority Data

Sep. 17, 2004 (CN) .................. 2004 2 0088476

(51) Int. Cl.
*F28D 15/00* (2006.01)
*F28F 7/00* (2006.01)
*H05K 7/20* (2006.01)

(52) U.S. Cl. .................. 165/104.33; 165/80.3; 165/185; 165/104.21

(58) Field of Classification Search ........... 165/80.3, 165/185, 104.21, 104.26, 104.31, 104.33, 165/104.34, 121–122, 124–125, 147; 361/695, 361/698–700; 257/715; 174/15.2
See application file for complete search history.

(56) References Cited

U.S. PATENT DOCUMENTS

| | | | |
|---|---|---|---|
| 5,019,880 A * | 5/1991 | Higgins, III. ............ 257/714 |
| 5,597,034 A * | 1/1997 | Barker et al. ............ 165/80.3 |
| 6,125,920 A * | 10/2000 | Herbert ................ 165/80.3 |
| 6,315,033 B1 | 11/2001 | Li |
| 6,419,007 B1 * | 7/2002 | Ogawara et al. ......... 165/80.3 |
| 6,439,298 B1 | 8/2002 | Li |
| 6,538,888 B1 * | 3/2003 | Wei et al. .............. 361/697 |
| 6,945,318 B1 * | 9/2005 | Ma et al. ............. 165/104.33 |
| 6,988,536 B1 * | 1/2006 | Lee et al. ............ 165/104.33 |
| 6,992,890 B1 * | 1/2006 | Wang et al. ............ 361/700 |
| 7,063,130 B1 * | 6/2006 | Huang ................. 165/121 |
| 2003/0007867 A1 * | 1/2003 | Chang ................. 415/220 |
| 2004/0226690 A1 * | 11/2004 | Lee et al. .............. 165/80.2 |
| 2005/0024830 A1 * | 2/2005 | Lee et al. .............. 361/699 |
| 2006/0011329 A1 * | 1/2006 | Wang et al. .......... 165/104.33 |

FOREIGN PATENT DOCUMENTS

TW 595307 6/2004

* cited by examiner

*Primary Examiner*—Tho Duong
(74) *Attorney, Agent, or Firm*—Morris Manning & Martin LLP; Tim Tingkang Xia, Esq.

(57) ABSTRACT

A heat dissipating device for a CPU includes a chassis (10), a heat sink (20), a fan cover (50) and a fan (60). The heat sink includes a coin-shaped connecting piece (22) and a plurality of cooling fins (30) arranged radially and defining an inter space for receiving the connecting piece. A plurality of airflow passages is formed between adjacent cooling fins. A plurality of heat pipes (40) is attached to a periphery of the cooling fins and the chassis. The fan cover partially surrounds the heat sink. The fan is secured to the fan cover to provide forced airflow through the airflow passages of the cooling fins radially.

15 Claims, 6 Drawing Sheets

HEAT DISSIPATING DEVICE

BACKGROUND

1. Field

The present invention relates generally to a heat dissipating device, and more particularly to a heat dissipating device for removing heat from an electronic device.

2. Prior Art

It is widely acknowledged that heat is produced during operations of electronic devices such as central processing units (CPUs) of computers. The heat produced must be quickly removed away to ensure the CPUs working normally. Typically, a heat dissipation device is provided to a CPU for removing heat from the CPU.

FIG. 6 shows a conventional heat dissipating device which includes a chassis 100 for contacting a CPU (not shown), a U-shaped heat pipe 120 in abutment with the chassis 100 and a plurality of spaced cooling fins 130 stacked along the heat pipe 120. The cooling fins 130 define a plurality of horizontal airflow passages 140 between adjacent cooling fins 130. A cooling fan (not shown) is mounted to one side of the heat dissipating device to cause forced airflow to run though the airflow passages 140 of the cooling fins 130 thereby enhancing the heat dissipating efficiency of the heat dissipating device. However, the forced airflow from the cooling fan flows through the cooling fins 130 only along a horizontal direction because the limitation of the extending direction of the airflow passages 140, which is only on the horizontal direction. Accordingly, the efficiency of the heat taken away by the airflow generated by the fan is not high. Furthermore, since the airflow is unidirectional on the horizontal direction, it cannot be used to cool electronic devices located near the CPU, for example, the voltage regulating module (VRM) or other similar heat-generating chips.

SUMMARY OF THE INVENTION

What is needed is a heat dissipating device which provides an enhanced efficiency to remove heat of a CPU by an airflow generated by a fan of the heat dissipating device, and the airflow so generated can also be used to remove heat generated by other electronic devices adjacent the CPU on which the heat dissipating device is mounted.

A heat dissipating device in accordance with a preferred embodiment of the present invention comprises a chassis, a cylindrical heat sink, at least one heat pipe, a fan cover and a fan. The heat sink is horizontally mounted and includes a cone-shaped connecting piece, a plurality of cooling fins arranged radially thereby defining an inter space for receiving the connecting piece. At least one heat pipe is attached to a periphery of the cooling fins and abuts the chassis. A plurality of airflow passages is formed between adjacent cooling fins. The fan cover surrounds the cooling fins and the fan provides forced airflow through the airflow passages of the cooling fins. The cooling fins guide the forced airflow to spread radially out of the cooling fins, whereby a portion of the forced airflow is oriented downwardly toward an electronic device near the CPU on which the heat dissipating device is mounted.

Other objects, advantages and novel features of the invention will become more apparent from the following detailed description when taken in conjunction with the accompanying drawings, in which:

DETAILED DESCRIPTION OF THE INVENTION

Figure 1:
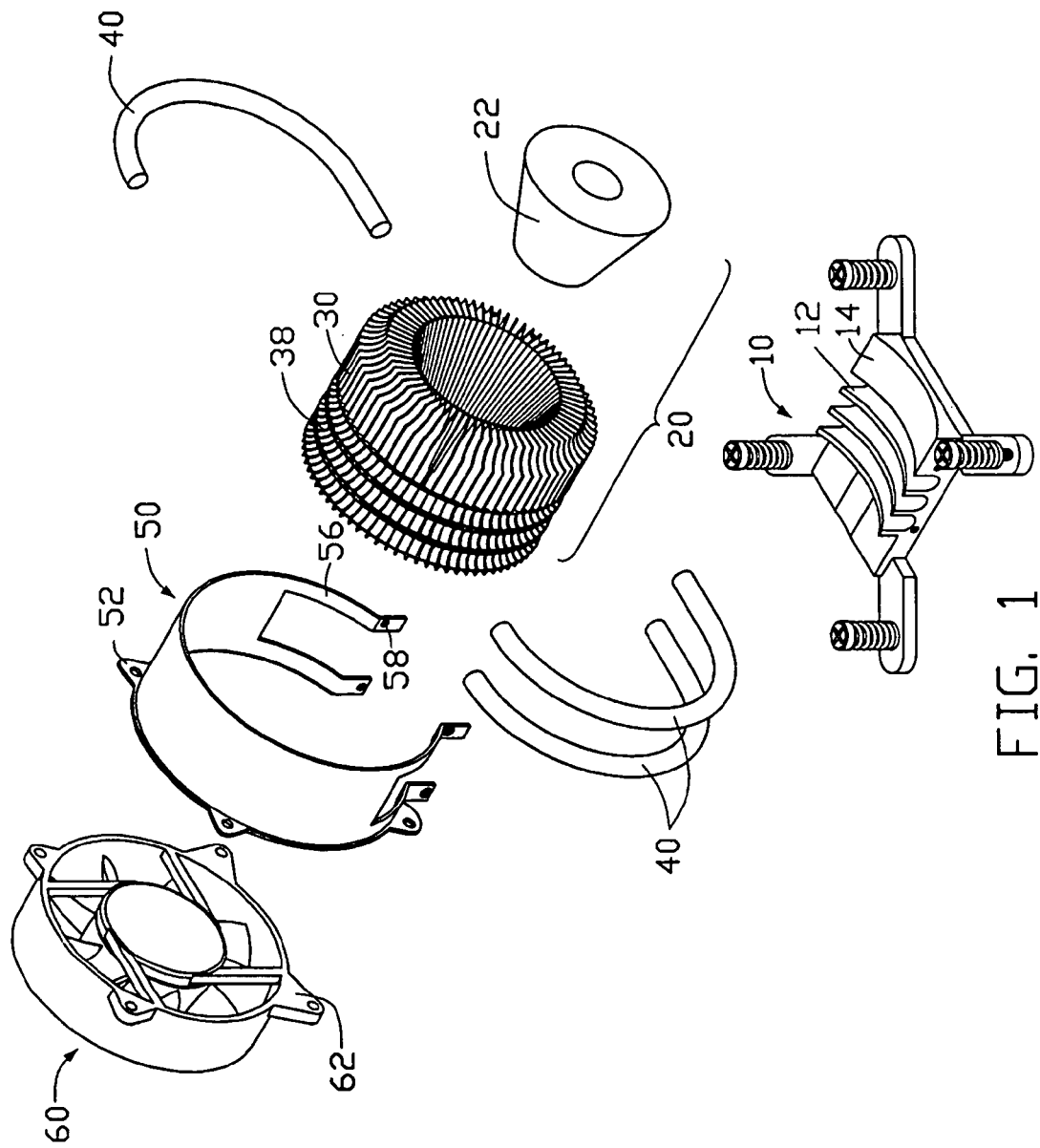
FIG. 1 is an exploded, isometric view of a heat dissipating device in accordance with a preferred embodiment of the present invention.

Reference will now be made to the drawing to describe the present invention in detail.

FIG. 1 illustrates a heat dissipating device in accordance with a preferred embodiment of the present invention. The heat dissipating device comprises a chassis 10, a heat sink 20, three heat pipes 40 each having a semicircular configuration, a fan cover 50 and a fan 60.

The chassis 10 has a bottom surface for contacting a CPU (not shown), a top surface defined three arc-shaped grooves 12 therein and an arc-shaped flake 14 formed beside the grooves 12 to support a periphery of the heat sink 20. The heat sink 20 comprises a cone-shaped connecting piece 22 and a plurality of cooling fins 30. The cooling fins 30 are arranged radially on an outer circumferential surface of the connecting piece 22 and secured thereto, whereby the heat sink 20 has a cylindrical configuration. A plurality of airflow passages (not labeled) are formed between adjacent cooling fins 30. The heat pipes 40 are transversely disposed in an outer circumferential periphery of the heat sink 20. The fan cover 50 is circular in shape, having two pair of locking legs 56 and four lugs 52 formed on a rear side thereof. The fan cover 50 has a width less than a length of the cooling fins 30 so as to partly cover the outer periphery of the heat sink 20 (See FIG. 4). The fan 60 is operative to generate a forced airflow toward the heat sink 20 and has four lugs 62 formed thereon, corresponding to the lugs 52 of the fan cover 50. The lugs 52, 62 are connected together by screws (not shown) thereby fastening the fan 60 to the rear side of the fan cover 50.

Figure 2:
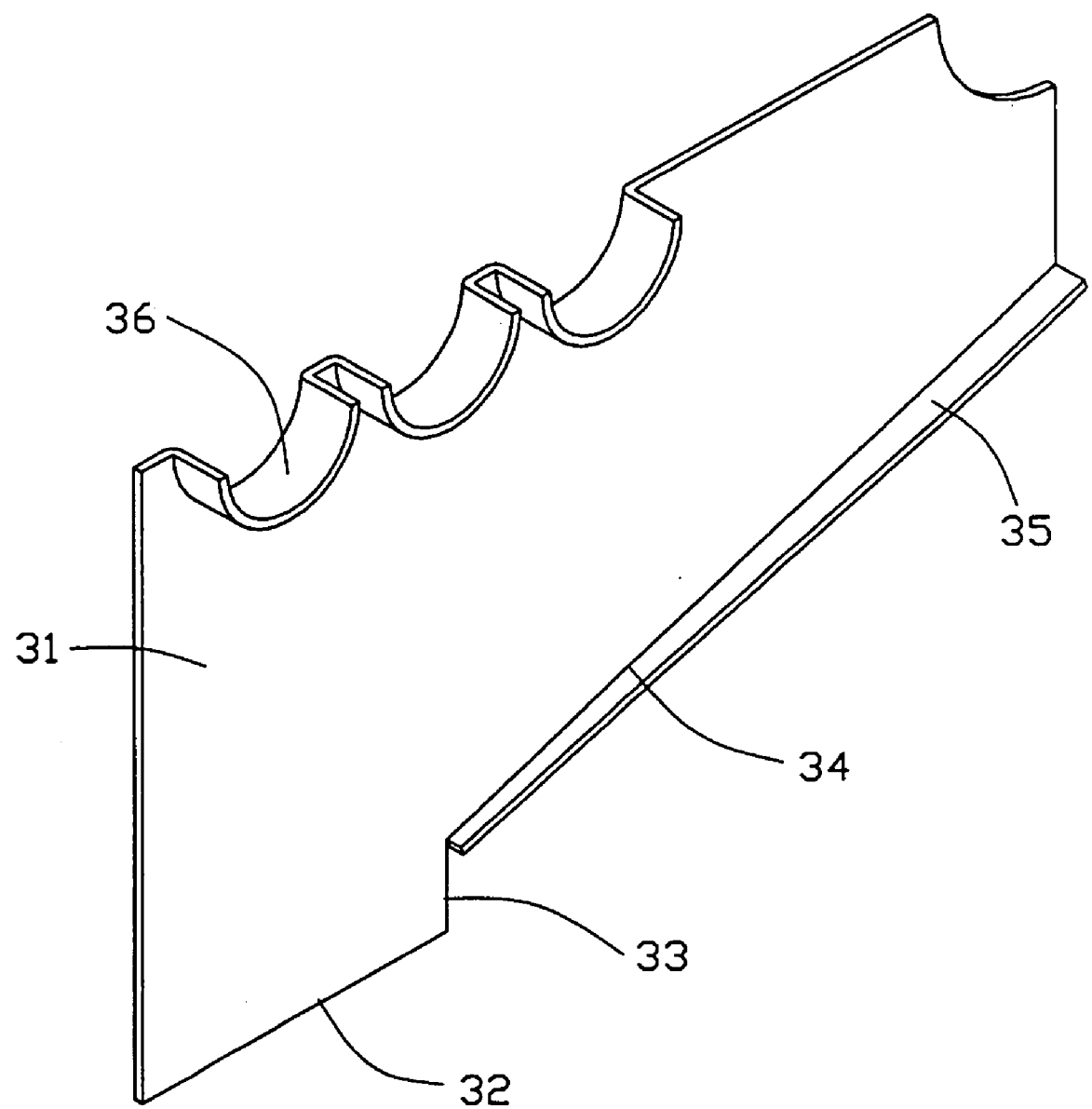
FIG. 2 is an isometric, enlarged view of a cooling fin of a heat sink the heat dissipating device of FIG. 1.

Referring also to FIG. 2, a cooling fin 30 is shown, where all cooling fins 30 have a same structure. The cooling fin 30 includes a main body 31 with a height thereof gradually decreased. Three semicircular flanges 36 are integrally formed on an upper edge of the cooling fin 30. The flanges 36 are provided to accommodate the heat pipes 40 on the heat sink 30. A bottom edge of the cooling fin 30 sequentially includes a horizontal section 32, a perpendicular section 33 and an inclined section 34. An abutting flange 35 transversely extends from the inclined section 34, for spacing an adjacent cooling fin 30 and increasing the contact surface area between the cooling fins 30 and the connecting piece 22, to thereby increase the connecting strength therebetween. The three semicircular flanges 36 of the cooling fins 30 commonly define three parallel grooves 38 (See FIG. 1) for receiving the heat pipes 40 therein.

Figure 3:
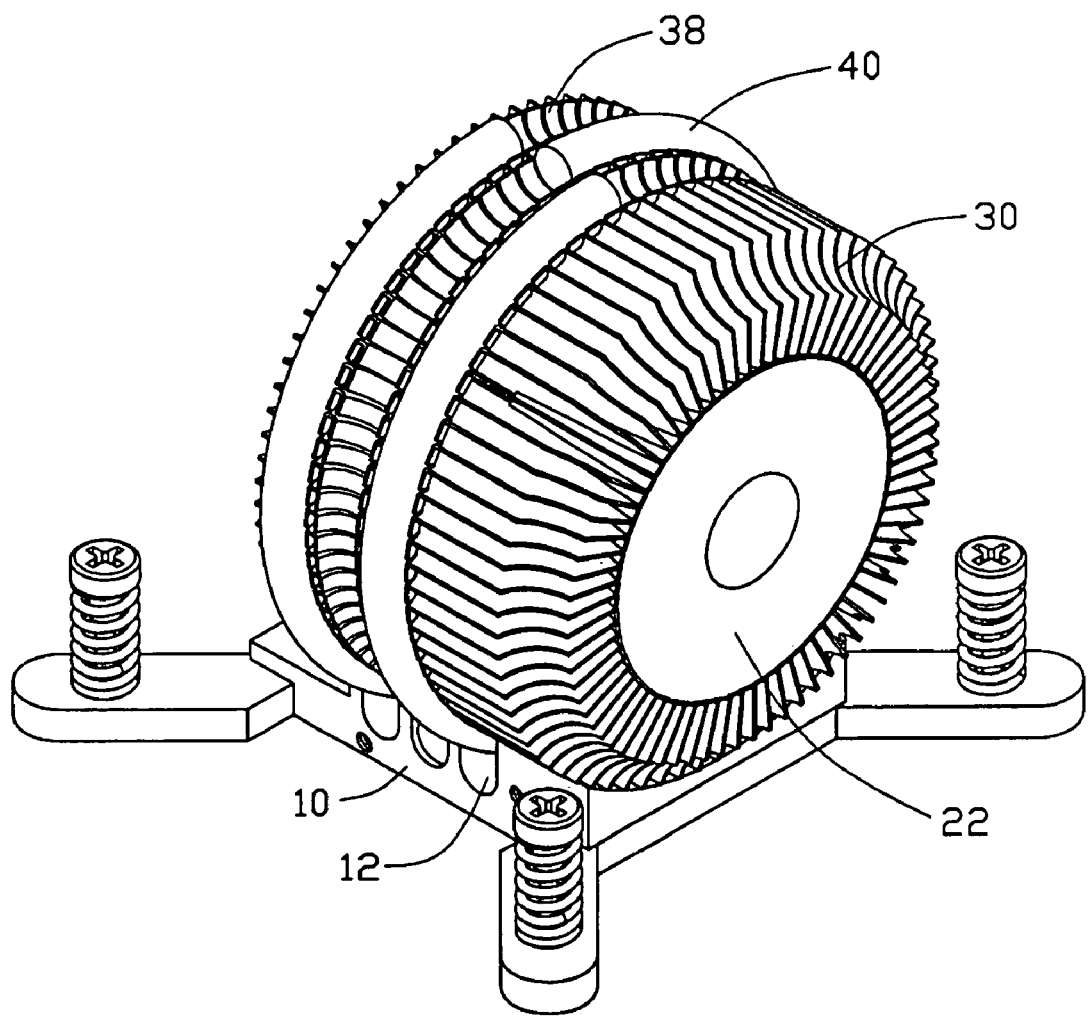
FIG. 3 is a partly assembled view of FIG. 1.
Figure 4:
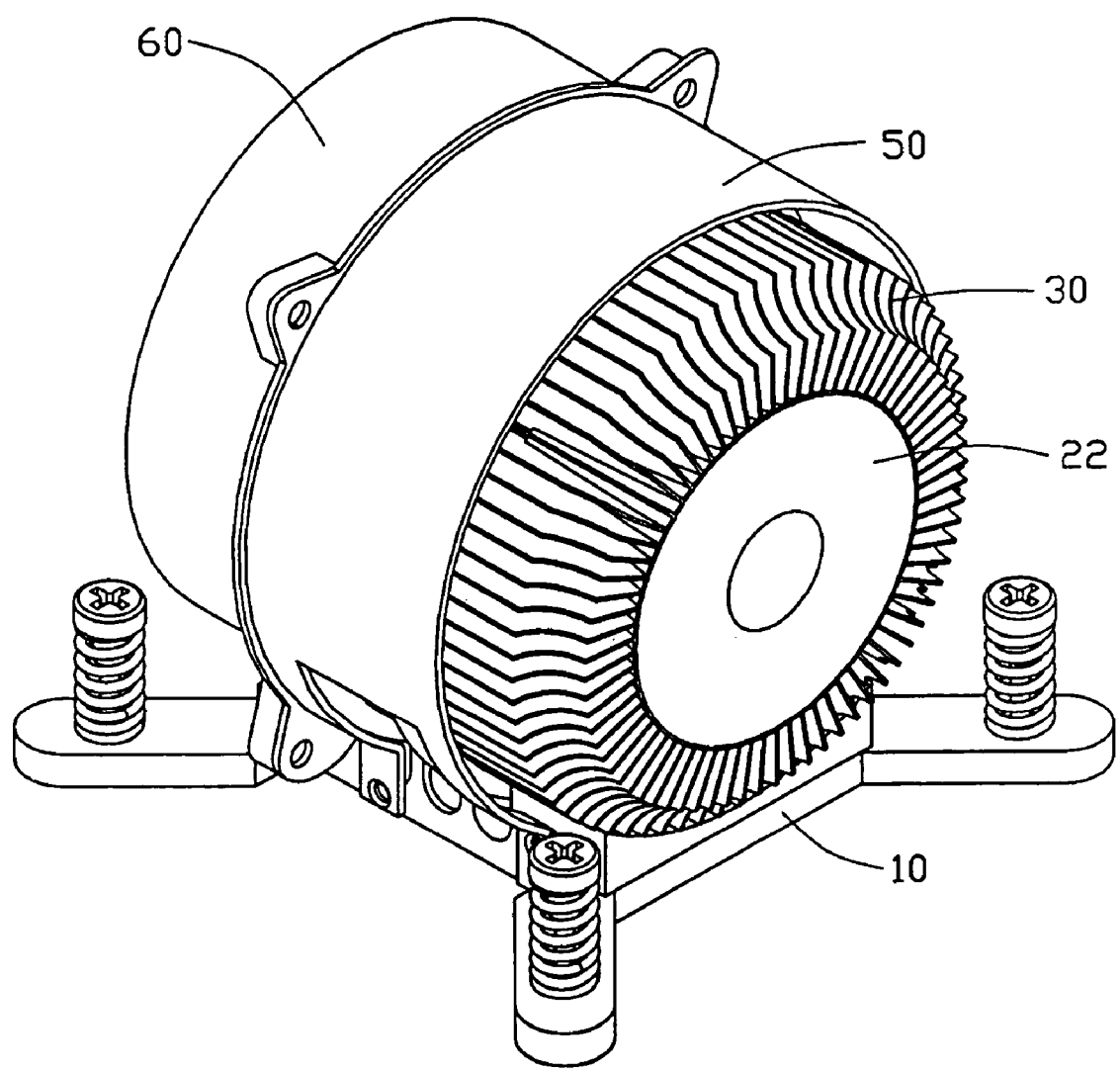
FIG. 4 is a fully assembled view of FIG. 1.
Figure 5:
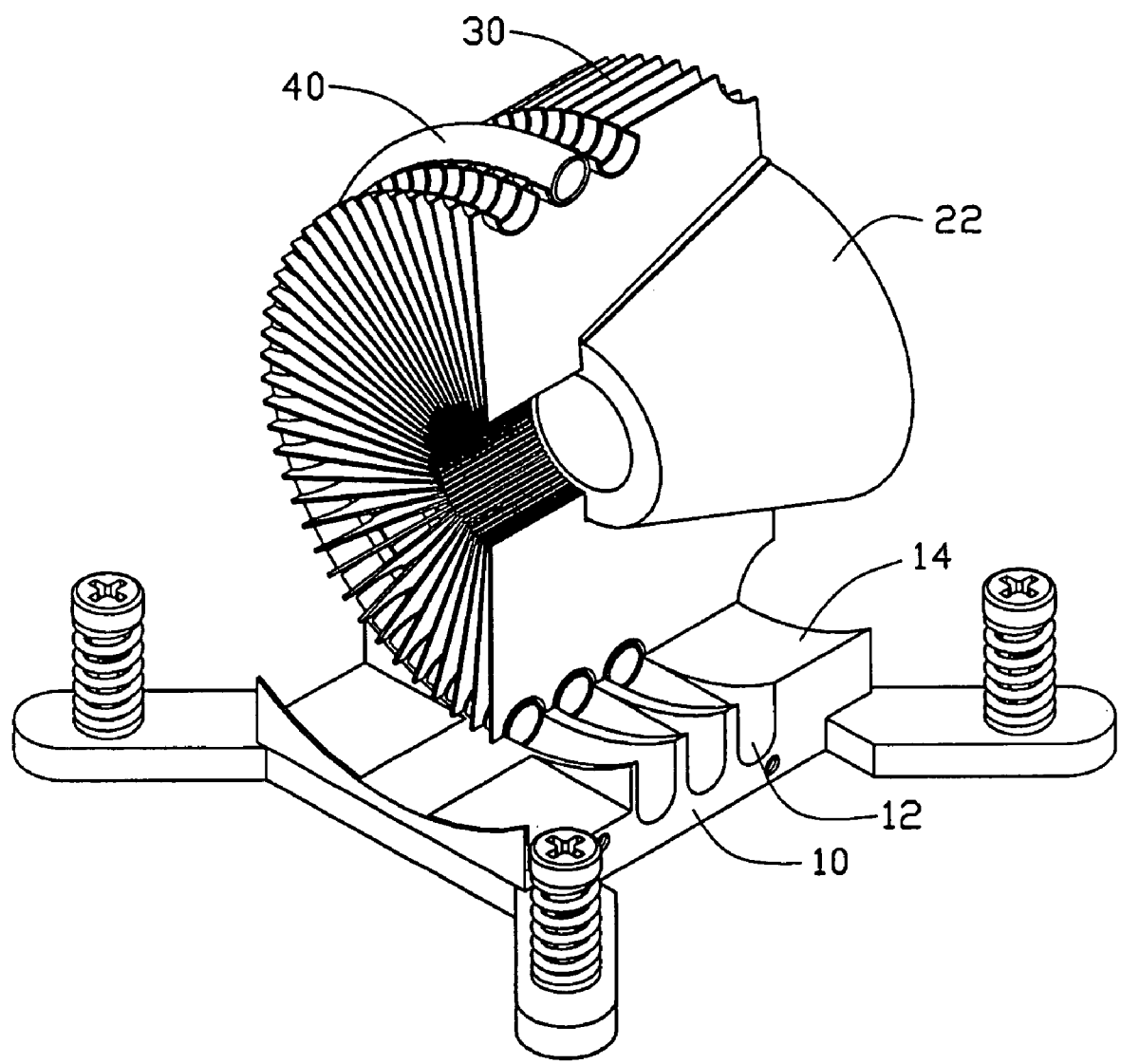
FIG. 5 is a view similar to FIG. 3 with a part being cut away to more clearly show an inner structure of the heat dissipating device.
Figure 6:
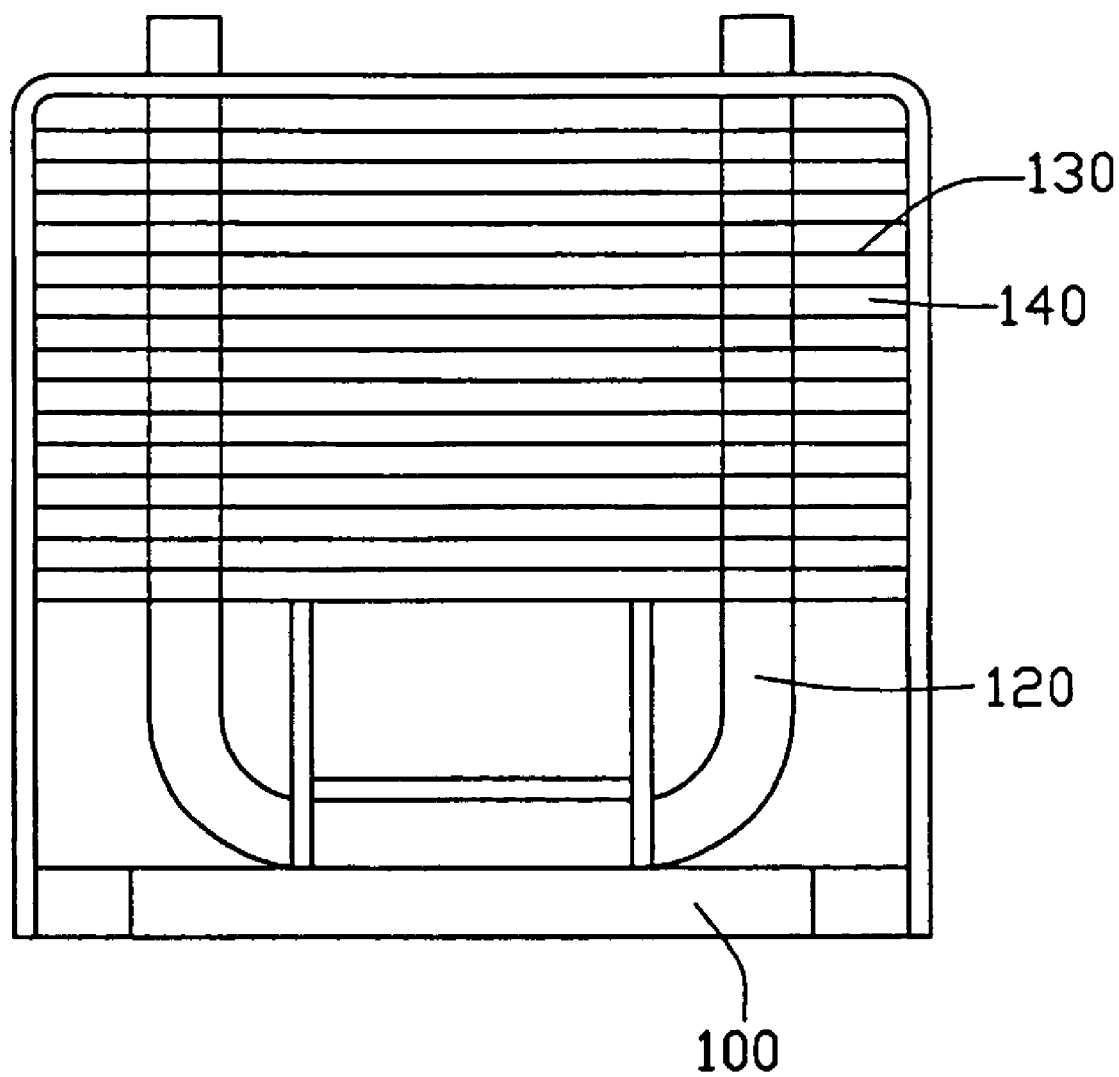
FIG. 6 is side elevation view of a conventional heat dissipating device.

Referring also to FIGS. 3–5, in assembly, a small end of the connecting piece 22 is brought to face to the fan 60 and inserted into an inter space defined by the cooling fins 30 until stopped by the perpendicular sections 33 of the cooling fins 30 (See FIG. 5). A large end of the connecting piece 22 is exposed. The heat pipes 40 are alternately embedded in the grooves 38 of the cooling fins 30 from left and right sides of the heat sink 20. The heat sink 20 in corporation with the heat pipes 40 then is placed on the chassis 10 with evaporating ends (not labeled) of the heat pipes 40 received in the grooves 12 of the chassis 10. Part of the heat sink 20 is placed on the flake 14 and supported thereby. The connecting piece 22, the cooling fins 30, the heat pipes 40 and the chassis 10 are then securely combined together via a soldering process, in which the abutting flanges 35 are soldered to the outer circumferential surface of the connecting piece 22. The heat sink 20 then is formed as having a cylindrical configuration mounted on the chassis 10 in a horizontal orientation. The fan cover 50 is secured around the heat sink 20 with the locking legs 56 thereof mounted on the chassis 10 via screws (not shown) or other conventional fasteners. The fan cover 50 covers a rear part of the heat sink 20 adjacent to the fan 60 to expose a front part thereof in which the connecting piece 22 is located. The fan 60 is then secured to the rear side of the fan cover 50 with the screws connecting the lugs 52, 62 together as mentioned above.

In operation, a forced airflow generated by the fan 60 runs across the airflow passages between the cooling fins 30 and then spreads radially and outwardly due to the guiding of the fan cover 50 and the connecting piece 22. A portion of the airflow is oriented downwardly which can be used to cool an IC chip, for example, a voltage regulating module (VRM) located near the CPU with which the chassis 10 contacts. The heat generated by the CPU is absorbed by the chassis 10 and transmitted to the evaporating ends of the heat pipes 40 soldered in the grooves 12 the chassis 10, and dissipated to the airflow through the fins 30 in contacting with the heat pipes 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipating device comprising:
   a chassis;
   a plurality of cooling fins arranged radially and defining an inter space, a plurality of airflow passages formed between adjacent cooling fins;
   at least one heat pipe attached to a periphery of the cooling fins and said chassis;
   a fan provided to the cooling flits for providing forced airflow through said airflow passages; and
   a cone-shaped connecting piece received in said inter space; and
   wherein an airflow generated by the fan flows through the airflow passages and guided by the cone-shaped connecting piece.

2. The heat dissipating device as claimed in claim 1, further comprising a fan cover partially sin-rounding the cooling fins at one end thereof adjacent to the fan.

3. The heat dissipating device as claimed in claim 2, wherein the fan cover is secured to the chassis.

4. The heat dissipating device as claimed in claim 2, wherein the fan is secured to the fan cover.

5. The heat dissipating device as claimed in claim 1, wherein the chassis defines at least one groove therein for receiving a part of the at least one heat pipe.

6. The heat dissipating device of claim 1, wherein the heat pipe has a shape of a semicircle.

7. The heat dissipating device of claim 1, wherein the cooling fins each have at least one semicircular flange arranged at an upper edge thereof to cooperatively receive the heat pipe therein.

8. The heat dissipating device of claim 7, wherein a bottom edge of each cooling flu comprises an inclined section corresponding to an outer circumferential surface of the connecting piece and an abutting flange formed from the inclined section for spacing adjacent cooling fins and increasing contact surface area between the cooling fins and the connecting piece.

9. The heat dissipating device of claim 7, wherein each cooling fin further comprises a horizontal section and a perpendicular section between the horizontal section and the inclined section, and one end of the connecting piece rests on the perpendicular section.

10. A heat dissipating device comprising:
    a chassis;
    a plurality of cooling fins arranged radially with a plurality of airflow passages formed between each adjacent fin, each cooling fin having an upper edge and a bottom side opposing said upper edge, the bottom edge having an inclined section so as to a height of the cooling fin gradually decreased along a lengthwise direction thereof an abutting flange formed from said inclined section for abutting each adjacent cooling fin;
    at least one heat pipe attached to a periphery of the cooling fins and said chassis;
    a fan cover surrounding the periphery of the cooling fins; and
    a fan attached to the fan cover for providing forced airflow to run across said airflow passages and spread radially out of the cooling fins.

11. The heat dissipating device of claim 10, wherein the fan cover partially surrounds the cooling fins at one end thereof.

12. The heat dissipating device of claim 10, wherein the heat pipe is substantially C-shaped.

13. The heat dissipating device of claim 10, wherein the chassis defines at least one groove therein for receiving the at least one heat pipe.

14. The heat dissipating device of claim 10, wherein the cooling fins each have at least one semicircular flange arranged at the upper edge thereof to cooperatively receive the heat pipe therein.

15. The heat dissipating device of claim 10, further comprising a cone-shaped connecting piece whose outer surface is in thermal contacted with the abutting flange.

* * * * *